US008675420B2

(12) United States Patent
Tanzawa et al.

(10) Patent No.: US 8,675,420 B2
(45) Date of Patent: Mar. 18, 2014

(54) DEVICES AND SYSTEMS INCLUDING ENABLING CIRCUITS

(75) Inventors: Toru Tanzawa, Tokyo (JP); Ali Feiz Zarrin Ghalam, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 155 days.

(21) Appl. No.: 13/116,914

(22) Filed: May 26, 2011

(65) Prior Publication Data
US 2012/0300556 A1 Nov. 29, 2012

(51) Int. Cl.
*G11C 7/10* (2006.01)
(52) U.S. Cl.
USPC .................. 365/189.05; 365/189.09
(58) Field of Classification Search
USPC ............................ 365/189.11, 189.05, 189.09
See application file for complete search history.

(56) References Cited

U.S. PATENT DOCUMENTS

| | | | |
|---|---|---|---|
| 5,844,853 A | 12/1998 | Kitsukawa et al. | |
| 5,886,932 A | 3/1999 | Choi et al. | |
| 5,999,466 A | 12/1999 | Marr et al. | |
| 6,384,672 B2 | 5/2002 | Oh | |
| 6,426,908 B1 | 7/2002 | Hidaka et al. | |
| 7,359,272 B2 | 4/2008 | Wang et al. | |
| 7,385,870 B2 * | 6/2008 | Watanabe et al. | 365/226 |
| 2008/0273383 A1 * | 11/2008 | Kim | 365/185.2 |
| 2010/0054035 A1 * | 3/2010 | Dono et al. | 365/182 |
| 2010/0205468 A1 | 8/2010 | Kim | |

FOREIGN PATENT DOCUMENTS

| | | |
|---|---|---|
| JP | 2010140563 | 6/2010 |
| KR | 20020028066 | 4/2002 |
| KR | 10-2009-0047982 | 5/2009 |

OTHER PUBLICATIONS

Nobunaga, Dean et al., "A 50 NM NAND Flash Memory With 100MB/s Program Throughput and 200MB/s DDR Interface", *ISSCC 2008*, Session 23, *Non-Volatile Memory 23.4* 2008, 426-427.
Int. Search Report and Written Opinion Received for Appln No. PCT/US2012/037956 dated Nov. 23, 2012.

* cited by examiner

*Primary Examiner* — Anthan Tran
(74) *Attorney, Agent, or Firm* — Dorsey & Whitney LLP

(57) ABSTRACT

Examples of devices and systems including enabling circuits are described. Two voltage supplies may be used to operate different portions of the devices, including peripheral circuits and I/O circuits. When the voltage supply to the peripheral circuits of one or more devices is disabled, the I/O circuits of that device may be disabled. In some examples, power may advantageously be saved in part by eliminating or reducing a DC current path through the I/O circuits.

26 Claims, 9 Drawing Sheets

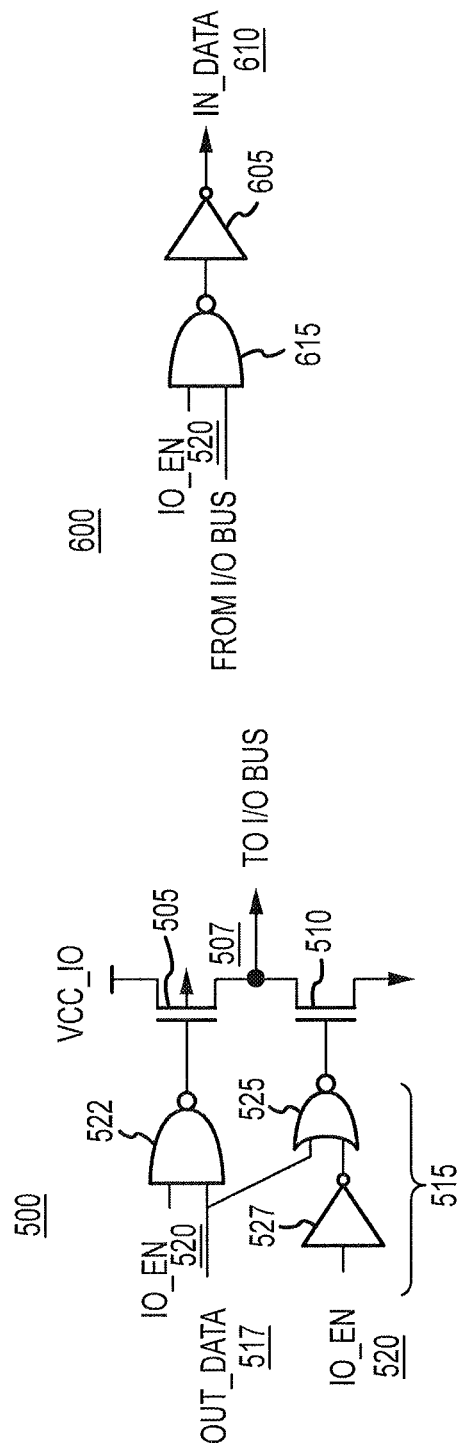

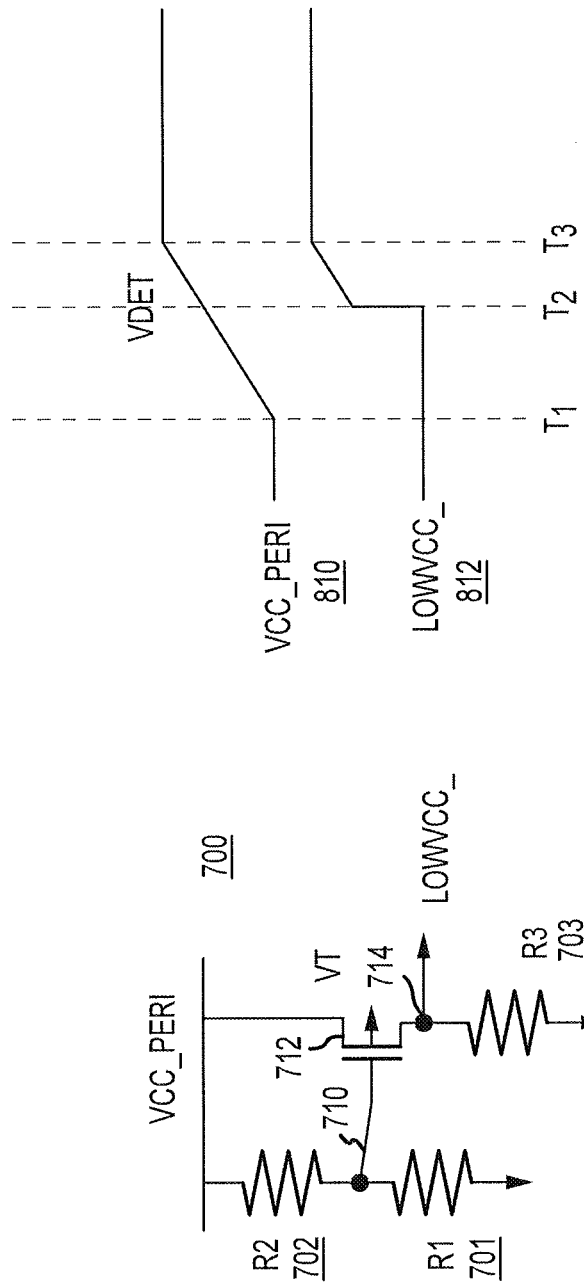

DEVICES AND SYSTEMS INCLUDING ENABLING CIRCUITS

TECHNICAL FIELD

Embodiments of the invention relate generally to semiconductor memory, and more particularly, examples of interface circuitry for dual supply voltage memory are described.

BACKGROUND

With increasing popularity of electronic devices, such as laptop computers, portable digital assistants, digital cameras, mobile phones, digital audio players, video game consoles and the like, demand for nonvolatile memories are on the rise. Nonvolatile memories come in various types, including flash memories. Flash memories are widely used nowadays for fast information storage in electronic devices such as those mentioned above. A flash memory cell is generally programmed by storing charge on a floating gate. The charge may thereafter remain on the gate for an indefinite period even after power has been removed from the flash memory device. Flash memory devices are therefore non-volatile.

Charge is stored on the floating gate by applying appropriate voltages to the control gate and the drain or source. For example, negative charge can be placed on the floating gate by grounding the source while applying a sufficiently large positive voltage to the control gate to attract electrons, which tunnel through the gate oxide to the floating gate from the channel region.

A flash memory cell can be read by applying a voltage to the control gate that is positive with respect to the source. The amount of charge stored on the flash memory cell determines the magnitude of the voltage that must be applied to the control gate to allow the flash memory cell to conduct current between the source and the drain. As negative charge is added to the floating gate, the threshold voltage of the flash memory cell increases thus increasing the magnitude of the voltage that must be applied to the control gate to allow the flash memory cell to conduct current. During a read operation, a read voltage is applied to the control gate that is large enough to render the cell conductive if insufficient charge is stored on the floating gate, but not large enough to render the cell conductive if sufficient charge is stored on the floating gate. During the read operation, the drain, which is used as the output terminal of the cell, is precharged to a positive voltage, and the source is coupled to ground. Therefore, if the floating gate of the flash memory cell is sufficiently charged, the drain will remain at the positive voltage. If the floating gate of the flash memory cell is not sufficiently charged, the cell will ground the drain.

Before a flash memory cell can be programmed, it may be erased by removing charge from the floating gate. The cell can be erased by applying a gate-to-source voltage to the cell that has a polarity opposite that used for programming. For example, the control gate can be grounded, and a large positive voltage applied to the source to cause the electrons to tunnel through the gate oxide and deplete charge from the floating gate. In another approach, a relatively large negative voltage is applied to the control gate, and a positive voltage, such as a supply voltage, is applied to the source region.

A typical flash memory device includes a memory array containing a large number of flash memory cells arranged in rows and columns. Two common types of flash memory array architectures are the "NAND" and "NOR" architectures, so called for the logical form in which the basic flash memory cell configuration of each is arranged. A typical flash memory array may include a large number of flash memory cells divided into a number of blocks. Each block may include a number of rows, with the cells in the same row having their control gates coupled to a common word line. Cells in the same column may have their sources and drains connected to each other in series. Thus all of the memory cells in the same column of each block are typically connected in series with each other. The drain of the upper flash memory cell in the block is coupled to a bit line through a select gate transistor. Each of the bit lines output a respective bit line signal BL1-BLN indicative of the data bit stored in the respective column of the array. The bit lines may extend through multiple blocks to respective sense amplifiers.

The storage capacity of a flash memory array can be increased by storing multiple bits of data in each flash memory cell. This can be accomplished by storing multiple levels of charge on the floating gate of each cell. These memory devices are commonly referred to as multi-bit or multi-level flash memory cells, known as "MLC memory cells." In MLC cells, multiple bits of binary data corresponding to distinct threshold voltage levels defined over respective voltage ranges are stored within a single cell. Each distinct threshold voltage level corresponds to a respective combination of data bits. Specifically, the number N of bits requires 2N distinct threshold voltage levels. For example, for a flash memory cell to store 2 bits of data, 4 distinct threshold voltage levels corresponding to bit states 00, 01, 10, and 11 are needed. When reading the state of the memory cell, the threshold voltage level for which the memory cell conducts current corresponds to a combination of bits representing data programmed into the cell. The two or more bits stored in each flash memory cell may be adjacent bits in the same page of data. However, more frequently, one bit is treated as a bit in one page of data, and the other bit is treated as the corresponding bit in an adjacent page of data. The bit states assigned to respective charge levels are normally the same for all rows of memory cells in an array. The bit states assigned to the flash memory cells in the array are usually implemented in hardware and thus cannot be changed during operation of the flash memory device.

Memory devices may utilize a relatively high voltage for read and program operations. In one example, 5V may be used for a read operation and 20V for a program operation. These voltages may be generated internally on the memory device from an externally-supplied voltage. The externally-supplied voltage may be 3V in one example. The line drivers and sense amplifiers used for read and program operations may operate using a boosted voltage generated based on this externally-supplied voltage.

Input and output buffer circuits on memory devices generally may need to drive an input/output bus coupled to the memory device. Because the bus may have a significant capacitance associated with it, the voltage used to drive the bus should generally be low. In some examples, the externally-supplied voltage used to generate the boosted voltage for read and program operations may be too high to be desirable for use by the input/output buffers.

Accordingly, memory devices may have a dual power supply. One externally-supplied voltage, generally referred to as $V_{cc\_io}$ may be used to operate power input/output circuitry and drive an input/output bus. In one example $V_{cc\_io}$ may be 1.8V. A second externally-supplied voltage, generally referred to as $V_{cc\_peri}$ may be used to power peripheral circuitry, such as line drivers and amplifiers used in read and program operations for the memory device.

FIG. 1 is a schematic illustration of a dual power supply memory device in accordance with the prior art. The memory device 100 may include a memory array 110 that may include any number of memory cells. Peripheral circuits 115 may be coupled to the memory array 110 and configured to read and program data into and out of the memory array 110. The peripheral circuits 115 are configured to receive an externally-supplied voltage $V_{cc\_peri}$. As mentioned above, the peripheral circuits 115 may include one or more voltage boost circuits that may boost the voltage of $V_{cc\_peri}$ to a voltage used for reading or programming the memory array 110. I/O circuits 120 may be coupled to the peripheral circuits 115 and an I/O bus 125. The I/O circuits 125 may include buffer circuits which receive data from the bus 125 or drive data onto the bus 125. The I/O circuits are configured to receive a second externally supplied voltage $V_{cc\_io}$. The $V_{cc\_io}$ voltage may be different than the $V_{cc\_peri}$ voltage. In particular, as mentioned above, the $V_{cc\_io}$ voltage may be lower than the $V_{cc\_peri}$ voltage. The I/O bus 125 is coupled to a memory controller 130.

BRIEF DESCRIPTION OF THE DRAWINGS

FIG. 5 is a schematic illustration of an output buffer in accordance with an example of the present invention.

FIG. 6 is a schematic illustration of an input buffer in accordance with an example of the present invention.

FIG. 7 is a schematic illustration of a voltage detector in accordance with an example of the present invention.

FIG. 8 is a schematic illustration of waveforms in accordance with an embodiment of the present invention.

DETAILED DESCRIPTION

As described above, memory devices may make use of multiple externally-supplied voltage supplies. As will be described further herein, one of those externally-supplied voltage supplies may be disabled (e.g. disconnected, shutdown, turned off, or otherwise become unavailable) during operation of the memory device. This may save power in some examples. Embodiments of the present invention may reduce or eliminate leakage current which may have otherwise resulted when disabling a voltage supply. While some embodiments of the present invention may provide this advantage or address the aforementioned problem, the advantages and problems are provided for ease of illustration, and it is to be understood that some examples of the invention may not provide any or all of the benefits described herein or address any or all of the drawbacks identified in the art. Embodiments of the present invention include systems. As used herein, a system may refer to a memory system or other systems. Systems according to described examples may include devices. As used herein, a device may refer to a memory device or other devices. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 1:
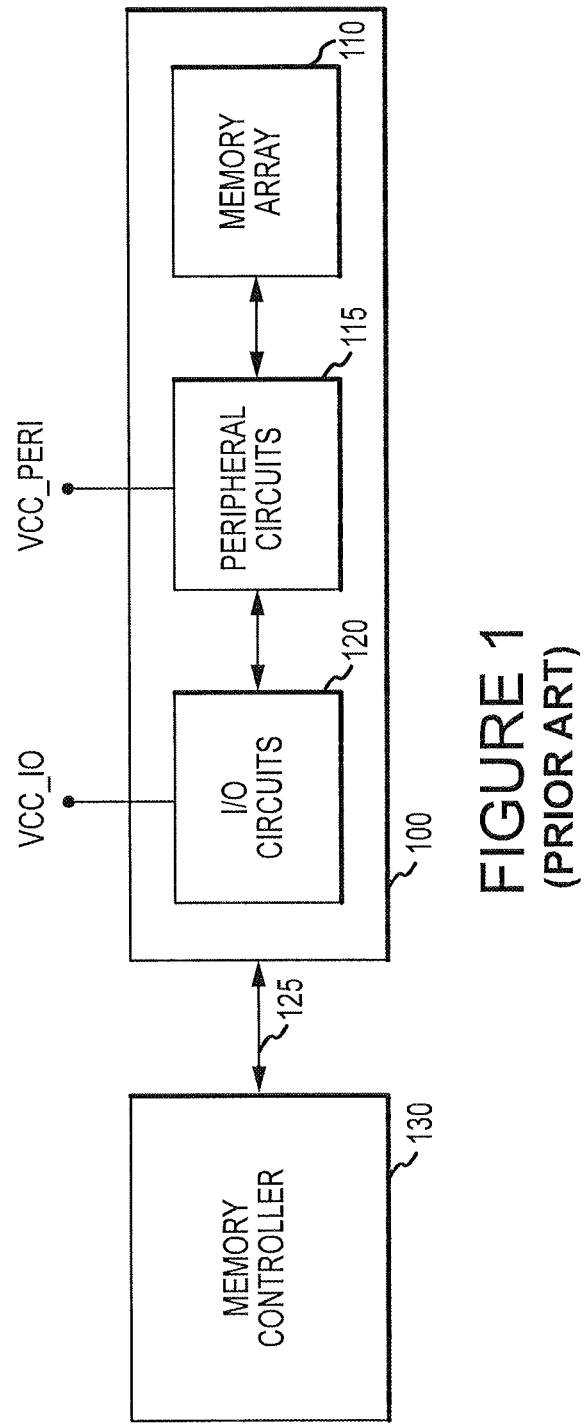
FIG. 1 is a schematic illustration of a dual power supply memory device in accordance with the prior art.
Figure 2:
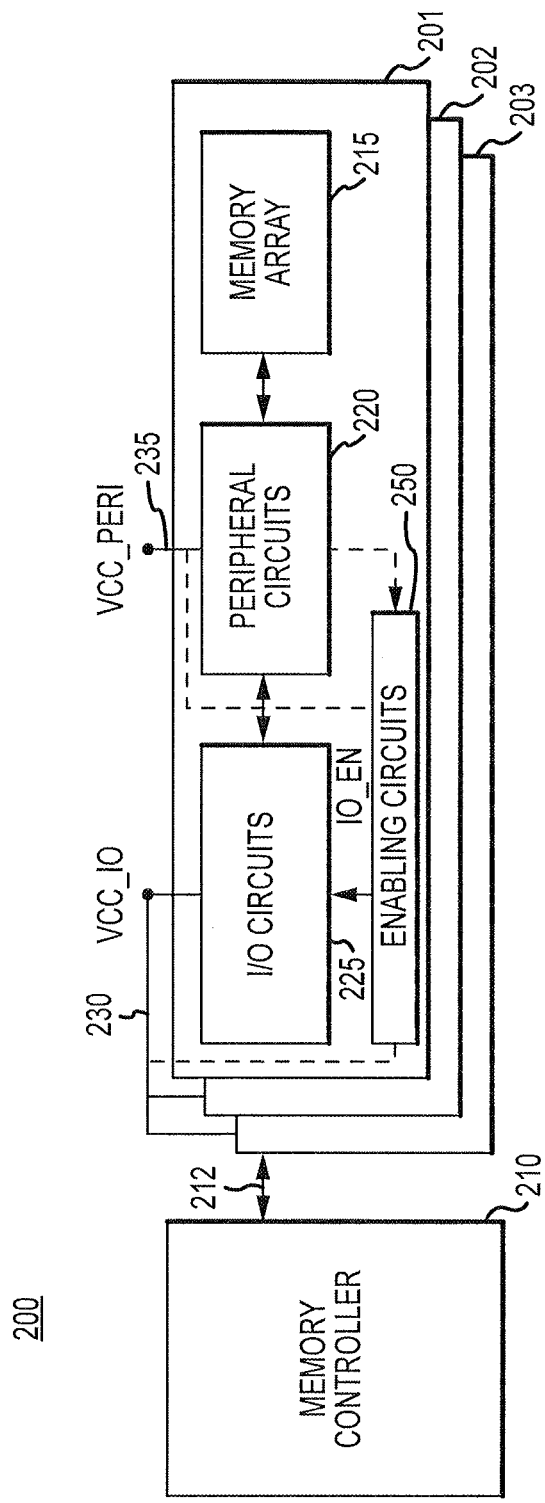
FIG. 2 is a schematic illustration of a memory system in accordance with an embodiment of the present invention.

FIG. 2 is a schematic illustration of a memory system in accordance with an embodiment of the present invention. The memory system 200 includes multiple memory devices 201, 202, 203 coupled to a memory controller 210 over a common I/O bus 212. The common I/O bus may be connected to each of the memory devices 201, 202, 203 for example using through-silicon vias (TSVs) or other through-substrate connections in embodiments using stacked memory systems. In other examples, the input/output bus 212 may be shared using other interconnections. While three memory devices 201, 202, 203 are shown in FIG. 2, any number may generally be used.

Each of the memory devices 201, 202, 203 may include a respective memory array. The memory array 215 is shown in FIG. 2 for the memory device 201. As generally stated, the memory array 215 may include any number of memory cells arranged in any manner. Typically, the memory cells of the memory array 215 may be arranged in rows and columns. Peripheral circuits 220 are coupled to the memory array 215. The peripheral circuits 220 may be configured to read and/or program data to and/or from the memory array 215. The peripheral circuits 220 may include, but are not limited to, amplifiers, drivers, decoders, or combinations thereof. The peripheral circuits 220 may be configured to receive an externally-supplied voltage $V_{cc\_peri}$. As mentioned above, in some examples, the peripheral circuits 220 may include one or more voltage boosting circuits that may boost the voltage of $V_{cc\_peri}$. I/O circuits 225 are coupled to the peripheral circuits 220 and the I/O bus 212. The I/O circuits may include, for example, input and/or output buffers which may receive data, command, and/or address signals from the I/O bus 212 and provide the data, command, and/or address signals to the I/O circuits 225 and the I/O circuits of the other memory devices 202 and 203. The I/O circuits 225 may in turn provide command, address, and/or data signals to the peripheral circuits 220 for use in reading and/or programming the memory array 215. Similarly, data read from the memory array may be driven onto the I/O bus 212 by the I/O circuits 225. The I/O circuits 225 are configured to receive an externally-supplied voltage $V_{cc\_io}$. As mentioned above, $V_{cc\_io}$ may be a different voltage than $V_{cc\_peri}$. In examples of the invention, $V_{cc\_io}$ may be lower than $V_{cc\_peri}$. In one example, $V_{cc\_io}$ may be 1.8V while $V_{cc\_peri}$ may be 3V.

The externally-supplied voltage $V_{cc\_io}$ may be provided to multiple memory devices in a memory system over a shared power supply bus. For example, in the memory system 200, $V_{cc\_io}$ is provided to the memory devices 201, 202, and 203 over power supply bus 230. $V_{cc\_peri}$, on the other hand, may be provided to memory devices of a system individually, or to fewer than all of the memory devices to which $V_{cc\_peri}$ is provided. In the example of FIG. 2, $V_{cc\_peri}$ is provided to the memory device 201 through an electrical connection 235 specific to the memory device 201. Separate electrical connections may be provided for the memory devices 202 and 203 to receive a voltage $V_{cc\_peri}$. Accordingly, in some examples, if $V_{cc\_io}$ were disabled, multiple memory devices may not receive $V_{cc\_io}$. However, $V_{cc\_peri}$ may be disabled for individual memory devices, or groups of memory devices, or generally fewer than all memory devices of a system.

As the number of memory devices used in systems has increased, the amount of standby power consumed has also increased. To reduce standby power, $V_{cc\_peri}$ may be disable. In some systems, power may be saved by disabling $V_{cc\_peri}$ for one memory device or selected memory devices while $V_{cc\_io}$ remains enabled. However, a problem may occur if $V_{cc\_peri}$ is disabled while $V_{cc\_io}$ remains enabled. The problem is that there may be a leakage path from $V_{cc\_io}$ to ground through the I/O circuits. Accordingly, direct current from $V_{cc\_io}$ to ground may flow, contributing to the power consumption of the device.

Examples of the present invention including enabling circuits which may disable I/O circuits of a memory device when $V_{cc\_peri}$ is disabled. Referring to FIG. 2, enabling circuits 250 are coupled to the I/O circuits 225. The enabling circuits 250 are configured to provide (e.g. generate) a control signal (e.g. an enable signal io_en). Responsive to a first state of the enable signal io_en, the I/O circuits are configured to be enabled and may couple signals to and/or from the I/O bus 212. Responsive to a second state of the enable signal io_en, however, the I/O circuits are configured to be disabled, such as to isolate them from the externally-supplied voltage supply $V_{cc\_io}$ and/or ground such that a DC current path is not formed through the I/O circuits 225. As will be described further below, in some examples, the enabling circuits 250 may be coupled to the externally-supplied voltage supplies $V_{cc\_io}$ and $V_{cc\_peri}$. In some examples, the enabling circuits 250 may be coupled to the peripheral circuits 220. Although only the enabling circuits 250 of the memory device 201 are shown in FIG. 2, it is to be understood that each of the memory devices 201, 202, and 203 may include respective enabling circuits to enable and/or disable their respective I/O circuits.

Figure 3:
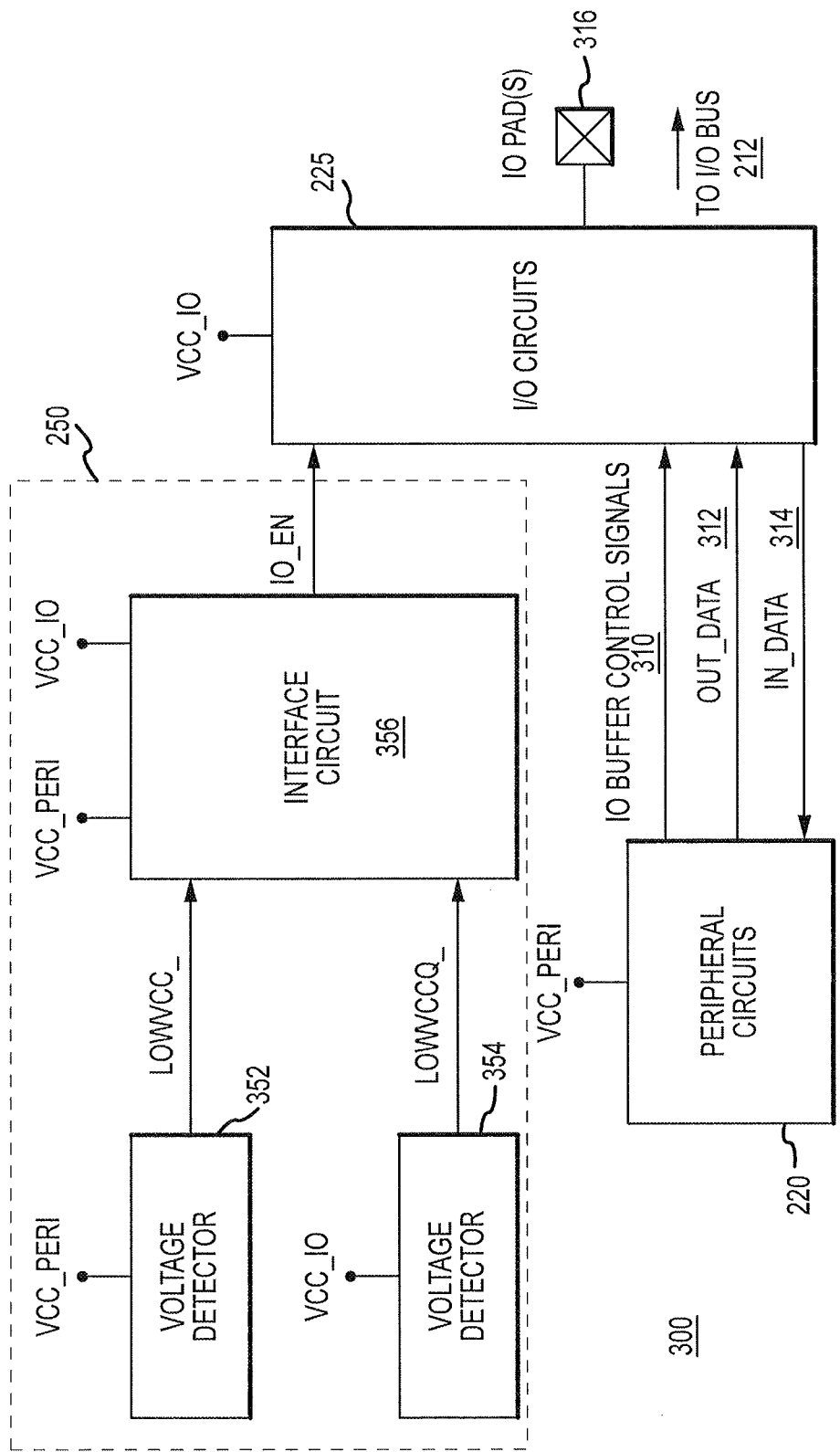
FIG. 3 is a schematic illustration of components of a memory device in accordance with an embodiment of the present invention.

In some examples of the present invention, the enabling circuits 250 may include circuitry configured to detect whether $V_{cc\_io}$ and/or $V_{cc\_peri}$ have been disabled. One such implementation is shown in FIG. 3. FIG. 3 is a schematic illustration of components of a memory device in accordance with an embodiment of the present invention. The memory device 300 includes several components labeled with like reference numbers as were shown in FIG. 2. The peripheral circuits 220 are configured to receive $V_{cc\_peri}$ and are coupled to the I/O circuits 225. The memory array 215 is not shown in FIG. 3, but may be coupled to the peripheral circuits 220. FIG. 3 illustrates I/O buffer control signals 310 which may be provided to the I/O circuits 225 from the peripheral circuits 220. Out_data 312 may be provided to the I/O circuits from the peripheral circuits 220. The Out_data 312 may represent data retrieved from a memory array. In_data 314 may be provided to the peripheral circuits 220 from the I/O circuits 225. The in_data 314 may represent data to be written to the memory array. As generally discussed above, the I/O circuits 225 may be provided with $V_{cc\_io}$ and may drive an I/O bus. The I/O circuits 225 may be connected to one or more externally-accessible terminals, such as the I/O pad 316 shown in FIG. 3. The I/O pad 316 may be connected to the I/O bus 212 of FIG. 2. The externally-accessible terminals, such as the I/O pad 316 may provide an interface for connecting an I/O bus to the memory device 300 and may generally take any suitable form, such as but not limited to, a bondpad, pin, or other interconnect.

As was generally described above, embodiments of the present invention provide a control signal that may enable and/or disable the I/O circuits of a memory device. In FIG. 3, an implementation of enabling circuits 250 is shown. The enabling circuits 250 are configured to provide the control signal, io_en. The enabling circuits 250 may include two voltage detectors 352, 354 and an interface circuit 356. The voltage detector 352 may be connected to the voltage supply $V_{cc\_peri}$. The voltage detector 352 may provide a signal Lowvcc_, where the state of the Lowvcc_ signal is indicative of whether the voltage $V_{cc\_peri}$ is lower than a threshold voltage. That is, the voltage detector 352 may compare the voltage received at a $V_{cc\_peri}$ input to a threshold. In the event the $V_{cc\_peri}$ voltage falls below a threshold, such as when the $V_{cc\_peri}$ voltage supply is disabled, the Lowvcc_ signal will so indicate. In one example, the Lowvcc_ signal has a high or logic '1' state when the voltage received at a $V_{cc\_peri}$ input is at a voltage high enough for circuit operation. In one example, that voltage may be 3V or higher. When the voltage received at the $V_{cc\_peri}$ input is lower than the threshold (3V in one example), the Lowvcc_ signal may transition to a low or logic '0' state.

In an analogous manner, the voltage detector 354 may be connected to the voltage supply $V_{cc\_io}$. The voltage detector 354 may provide a signal Lowvccq_, where the state of the Lowvccq_ signal is indicative of whether the voltage $V_{cc\_io}$ is lower than a threshold voltage. That is, the voltage detector 354 may compare the voltage received at a $V_{cc\_io}$ input to a threshold. In the event the $V_{cc\_io}$ voltage falls below a threshold, such as when the $V_{cc\_io}$ voltage supply is disabled, the Lowvccq_ signal will so indicate. In one example, the Lowvccq_ signal has a high or logic '1' state when the voltage received at a $V_{cc\_io}$ input is at a voltage high enough for circuit operation. In one example, that voltage may be 1.8V or higher. When the voltage received at the $V_{cc\_io}$ input is lower than the threshold (1.8V in one example), the Lowvccq_ signal may transition to a low or logic '0' state.

Any suitable voltage detectors may be used to implement the voltage detectors 352 and 354. In some examples, the voltage detectors 352, 354 may each include a bandgap reference and comparison circuitry for comparing the $V_{cc\_peri}$ and $V_{cc\_io}$ voltages, respectively, to a reference voltage.

The interface circuit 356 is configured to receive the Lowvcc_ and Lowvccq_ signals and provide the io_en signal. As shown in FIG. 3, the interface circuit 356 may also be coupled to the $V_{cc\_peri}$ and $V_{cc\_io}$ supply voltages. Generally, the io_en signal will be indicative of whether or not both the $V_{cc\_peri}$ and $V_{cc\_io}$ supply voltages are enabled and at a sufficient voltage for circuit operation. If either of the supply voltages have been disabled, the io_en signal will so indicate and disable the I/O circuits 225 (e.g. decouple the circuits from one or more externally-accessible terminals), such as to avoid creating a DC current path through the I/O circuits, as was generally described above. Accordingly, the interface circuit 356 may generally provide the io_en signal in accordance with the below table:

|  | Case | | | |
| --- | --- | --- | --- | --- |
|  | 1 | 2 | 3 | 4 |
| $V_{cc\_peri}$ | High (e.g. 3 V) | Low (e.g. <3 V) | High (e.g. 3 V) | Low (e.g. <3 V) |

-continued

| | Case | | | |
|---|---|---|---|---|
| | 1 | 2 | 3 | 4 |
| $V_{cc\_io}$ | High (e.g. 1.8 V) | High (e.g. 1.8 V) | Low (e.g. <1.8 V) | Low (e.g. <1.8 V) |
| io_en | High (e.g. 1.8 V) | Low (e.g. 0 V) | Low (e.g. 0 V) | N/A |

Case 1 corresponds to a normal bias condition where the memory device may be available for read and program operations. Cases 2 and 3 are conditions where one of the two power supply voltages are disabled. In these cases, a low io_en signal may disable an interconnection between externally accessible terminals and the I/O circuits. Case 2 includes a situation where $V_{cc\_peri}$ is equal to 0V, which may indicate $V_{cc\_peri}$ is disabled. In case 2, referring back to FIG. 3, the peripheral circuits 220 may not consume any power since the power supply is disabled. Accordingly, the voltages of IO buffer control signals 310 and out_data 312 may be unknown. However, the io_en signal may have disabled the I/O circuits 225 such that no DC current may flow through the I/O circuits 225. As will be described further below, circuits included in the I/O circuits 225 may include an io_en input to ensure no DC current flows in the circuits when io_en signal is low. Case 3 includes a case where $V_{cc\_io}$=0V, indicating the $V_{cc\_io}$ voltage supply may have been disabled. In such a situation, referring back to FIG. 3, the I/O circuits 225 may not consume any power since they are not receiving a voltage supply. Accordingly, the voltage level of the in_data 314 of FIG. 3 may be unknown. The peripheral circuits 220 may also have an io_en input to ensure no DC current may flow through the peripheral circuits 220.

Figure 4:
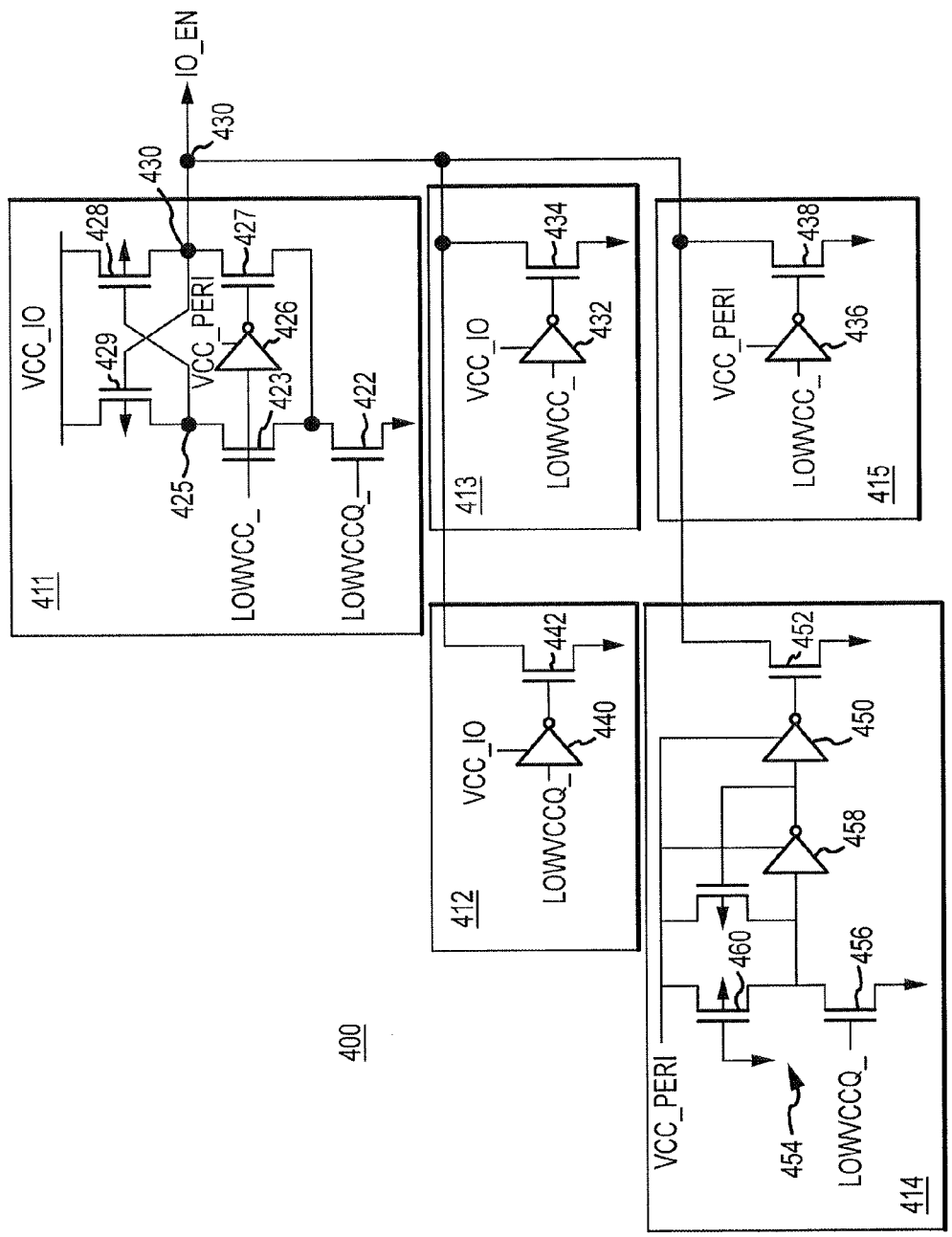
FIG. 4 is a schematic illustration of an interface circuit in accordance with an embodiment of the present invention.

As it will be appreciated, a variety of circuits may be used to implement the interface circuit 356 to act in accordance with the above table. One example of an implementation of an interface circuit is shown in FIG. 4. FIG. 4 is a schematic illustration of an interface circuit in accordance with an embodiment of the present invention. The interface circuit 400 may be used to implement the interface circuit 356 of FIG. 3. The interface circuit 400 includes five sub-circuits 411-415.

The sub-circuit 411 is configured to pull the io_en signal up to $V_{cc\_io}$ when both Lowvcc_ and Lowvccq_ are high. That is, the sub-circuit 411 may be used to implement Case 1 in the table above. Recall as described above with reference to FIG. 3, that a high Lowvcc_ signal indicates that $V_{cc\_peri}$ is at a sufficient voltage for device operation and a high Lowvccq_ signal indicates that $V_{cc\_io}$ is at a sufficient voltage for device operation. When both Lowvcc_ and Lowvccq_ are high, the n-FET transistors 422, 423 may both be turned on, connecting the node 425 to ground. The inverter 426, powered by $V_{cc\_peri}$, may invert the high Lowvcc_ signal to a low, and the n-FET transistor 427 may be turned off. With the node 425 coupled to ground, the gate of the p-FET transistor 428 may be at ground, turning the p-FET transistor 428 on and coupling the output node 430 to $V_{cc\_io}$. The node 430 being at $V_{cc\_io}$ may turn off the p_FET transistor 429.

The sub-circuits 413 and 415 may be used to implement Case 2 in the Table above, where $V_{cc\_peri}$ may be low. Accordingly, the Lowvcc_ signal may be low while the Lowvccq_ signal may be high. The subcircuit 413 includes an inverter 432 powered by $V_{cc\_io}$. The inverter may invert the Lowvcc_ signal to a high signal, turning on the n-FET transistor 434. Turning on the n-FET transistor 434, may pull the node 430 (e.g. the io_en signal) down to ground. The subcircuit 415 includes an inverter 436 powered by $V_{cc\_peri}$. The inverter may invert the Lowvcc_ signal to a high signal, turning on the n-FET transistor 438. Turning on the n-FET transistor 438 may pull the node 430 (e.g. the io_en signal) down to ground. The subcircuits 413 and 415 are similar except for the inverter 432 is powered by $V_{cc\_io}$ and the inverter 436 is powered by $V_{cc\_peri}$. The two subcircuits 413 and 415 therefore provide some redundancy in the event that one or the other power supply voltage becomes disabled or unstable.

The sub-circuits 412 and 414 may be used to implement Case 3 in the Table above, where $V_{cc\_io}$ may be low. Accordingly, the Lowvccq_ signal may be low while the Lowvcc_ signal may be high. The subcircuit 412 includes an inverter 440 powered by $V_{cc\_io}$. The inverter may invert the Lowvccq_ signal to a high signal, turning on the n-FET transistor 442. Turning on the n-FET transistor 442 may pull the node 430 (e.g. the io_en signal) down to ground. The subcircuit 414 includes an inverter 450 and a pull-down n-FET transistor 452. Recall, however, that the Lowvccq_ signal is provided based on the $V_{cc\_io}$ signal such that a high Lowvccq_ signal may have a magnitude equal to the $V_{cc\_io}$ power supply (e.g. 1.8V). Accordingly, the Lowvccq_ signal may not be provided directly to the inverter 450 powered by $V_{cc\_peri}$ because the high Lowvccq_ signal at $V_{cc\_io}$ may not be high enough to be inverted by the inverter 450. Accordingly, level converter circuitry 454 is provided. The Lowvccq_ signal is provided to a gate of a n-FET transistor 456. When the Lowvccq_ signal is low, the n-FET transistor 456 may be turned on, providing a low voltage to an inverter 458. The inverter 458 may then provide a high signal to the inverter 450, which in turn provides a low signal to a gate of the transistor 452, which is insufficient to turn on the n-FET transistor 452. When the Lowvccq_ signal is low, the n-FET transistor 456 may not be turned on. The p-FET transistor 460 is turned on by a ground voltage applied to its gate, and therefore provides a high voltage based on $V_{cc\_peri}$ to the input of the inverter 458. The inverter 458, powered by $V_{cc\_peri}$, accordingly provides a low voltage to the input of the inverter 450, which in turn provides a high voltage to the gate of the transistor 452. The transistor 452 may then turn on, pulling node 430 (e.g. the io_en signal) to ground. Accordingly, when the Lowvccq_ signal is low, the subcircuit 414 may pull the io_en signal low. Although one implementation of level converter circuitry 454 is shown in FIG. 4, other implementations of level converter circuitry may be used in other examples.

Accordingly, examples of interface circuits, including the interface circuit 400 of FIG. 4 have been described. The interface circuit 400 may be used to implement the interface circuit 356 of FIG. 3. Although the interface circuit 400 is shown with multiple subcircuits, some of the subcircuits, such as the subcircuit 412, may not be needed in some embodiments. Recall the interface circuit is used to provide an io_en signal that may be used to enable or disable I/O circuits, such as the I/O circuits 225 of FIG. 3. Accordingly, examples of I/O circuits configured to be enabled or disabled responsive to an io_en signal will now be described.

FIG. 5 is a schematic illustration of an output buffer in accordance with an example of the present invention. The output buffer 500 may be included in the I/O circuits 225 of FIG. 3, for example, and may couple to the I/O bus 212. The output buffer 500 includes p-FET transistor 505 and n-FET transistor 410. The p-FET transistor 505 is coupled between $V_{cc\_io}$ and an output node 507. The n-FET transistor 510 is coupled between ground an the output node 507. In this manner, when the n-FET transistor 510 is on, the node 507 may be pulled down to ground, while when the p-FET transistor 505 is on, the node 507 may be pulled up to $V_{cc\_io}$.

Logic circuitry 515 provides control signals for the gates of the transistors 505 and 510 based on a combination of output data signals 517 and the io_en signal 520. The output data signals 517 may be the out_data signals 312 shown in FIG. 3, for example. Referring again to FIG. 5, the logic circuitry 515 includes a NAND gate 522 having an output coupled to a gate of the transistor 505. The NAND gate receives the io_en signal 520 and the output data signals 517 at respective inputs of the NAND gate 522. When the io_en signal 520 is low, the output of the NAND gate 522 may be high regardless of the state of the output data signals 517. Accordingly, when the io_en signal 520 is low, the transistor 505 may be prevented from turning on. However, when the io_en signal 520 is high, the signal provided by the NAND gate 522 to the transistor 505 may be based on the value of the output data signals 517. The logic circuitry 515 further includes a NOR gate 525 coupled to a gate of the transistor 510. The io_en signal 520 is provided to one input of the NOR gate 525 by an inverter 527. When the io_en signal 520 is low, the inverter 527 may provide a high signal to one input of the NOR gate 525, which may in turn provide a low signal to the gate of the transistor 510, which may prevent the transistor 510 from turning on. In this manner, the output buffer 500 may be disabled by a low io_en signal. When the io_en signal 520 is high, however, the output of the NOR gate 525 may be at a state determined by the value of the output data signals 517. Accordingly, a high io_en signal may enable the output buffer 500.

FIG. 6 is a schematic illustration of an input buffer in accordance with an example of the present invention. The input buffer 600 may be included in the I/O circuits 225 of FIG. 3, for example. The input buffer 600 includes an inverter 605 that may provide an in_data signal 610. The in_data signal 610 may correspond, for example to the in_data signal 314 of FIG. 3. The input buffer 600 further includes a NAND gate 615. The NAND gate 615 may receive the io_en signal 520 at one input and data signals from an I/O bus at the other input. The data signals may be received, for example, from the I/O bus 212 as shown in FIG. 3. Referring again to FIG. 6, if the io_en 520 signal is low, the output of the NAND gate may be high regardless of the state of the data signals from the I/O bus. The high output of the NAND gate 615 may be provided to the inverter 605, which in turn may provide a low in_data signal 610. In this manner, a low io_en signal 520 may disable the input buffer 600. When the io_en signal 520 is high, an output of the NAND gate may depend on the state of the data signals received from the I/O bus, and accordingly the output of the inverter 605 may also correspond to the state of data signals received from the I/O bus. In this manner, the input buffer 600 may be enabled responsive to a high io_en signal.

Accordingly, examples of interface circuits have been described above which may provide an io_enable signal based on a determination of whether $V_{cc\_io}$ and/or $V_{cc\_peri}$ have been disabled. FIG. 7 is a schematic illustration of a voltage detector in accordance with an example of the present invention. The voltage detector 700 may be used to implement the voltage detector 352 of FIG. 3. An analogous voltage detector circuit may be used to implement the voltage detector 354 of FIG. 3. Referring again to FIG. 7, the voltage detector 700 may include resistors 701-703. Although resistors are shown, any circuit elements having a resistance may be used. The resistor 701 has a value R1 and is coupled between a node 710 and ground. The resistor 702 has a value R2 and is coupled between $V_{cc\_peri}$ and the node 710. The node 710 is coupled to a gate of the p-FET transistor 712. The source of the p-FET transistor 712 is coupled to $V_{cc\_peri}$ and the drain of the p-FET transistor 712 is coupled to an output node 714. The resistor 703 has a value R3 and is coupled between the node 714 and ground. When $V_{cc\_peri}$ is sufficiently low, the transistor 712 may be off, and the resistor 703 may pull the node 714 down to ground, accordingly the voltage detector 700 may provide a low Lowvcc_ signal. When $V_{cc\_peri}$ is above a determined voltage as set by the circuit components, the transistor 712 may turn on, pulling the Lowvcc_ signal up.

FIG. 8 is a schematic illustration of waveforms in accordance with an embodiment of the present invention. The $V_{cc\_peri}$ waveform 810 is shown, as is the Lowvcc_ waveform 812. As shown in FIG. 8, the $V_{cc\_peri}$ voltage source had been disabled, such that the $V_{cc\_peri}$ signal was low, and the Lowvcc_ signal was accordingly also low. At a time $t_1$, the $V_{cc\_peri}$ voltage source begins transitioning to a high level. The Lowvcc_ signal, however, remains low. At a time $t_2$, the $V_{cc\_peri}$ signal reaches a voltage $V_{det}$. Once $V_{det}$ is reached, the Lowvcc_ signal transitions. By time $t_3$, both the $V_{cc\_peri}$ and Lowvcc_ signals have transitioned high. The voltage $V_{det}$ is set based on circuit parameters of the voltage detector 700 of FIG. 7. If the threshold voltage of the transistor 712 is $V_t$, an equality can be written:

$R2/(R1+R2)V_{det}=|V_t|$; which may be written as:

$V_{det}=|V_t|\times(1+R1/R2)$. In this manner, the voltage $V_{det}$ may be set by selecting the values of R1, R2, and $V_t$.

Although examples have been described above where a high io_en signal is used to enable I/O circuits and a low io_en signal is used to disable the I/O circuits, in other implementations the opposite states may be used—a low io_en signal may enable I/O circuits while a high io_en signal may disable I/O circuits. The interface circuitry and/or I/O circuitry may be modified accordingly.

Referring back to FIG. 2, examples of enabling circuits 250 have been described above which may include voltage detectors or signals indicative of a voltage level of a power supply. For example, the enabling circuits shown in FIG. 3 include two voltage detectors and an interface circuit. In other examples of the present invention, a controller may provide a disable command signal indicative of a power supply voltage being disabled. Examples of enabling circuits which may receive such a disable command will now be described.

Figure 9:
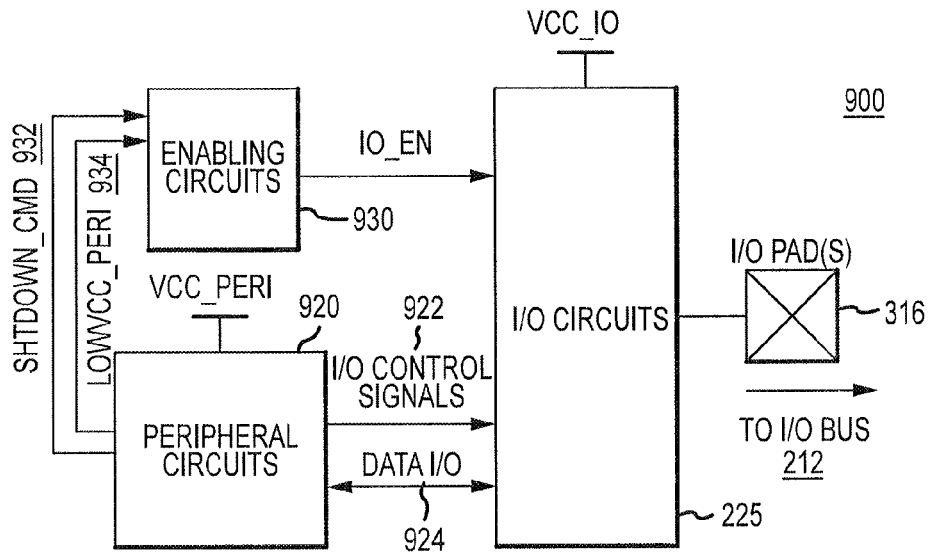
FIG. 9 is a schematic illustration of components of a memory device in accordance with an embodiment of the present invention.

FIG. 9 is a schematic illustration of components of a memory device in accordance with an embodiment of the present invention. The memory device 900 includes many similar components to those shown in FIGS. 2 and 3, labeled with like reference numbers. The I/O circuits 225 are powered by $V_{cc\_io}$ and coupled to I/O pads, with the I/O pad 316 shown in FIG. 9. Peripheral circuits 902 may be powered by $V_{cc\_peri}$. The peripheral circuits 920 may provide I/O control signals 922 to the I/O circuits 225 for driving the I/O bus 212. Data signals 924 may be provided between the peripheral circuits 920 and the I/O circuits 225.

As shown in FIG. 9, the peripheral circuits 920 may provide signals to the enabling circuits 930, the disable command signal shtdwn_cmd 932 and a low $V_{cc\_peri}$ signal Lowvcc_peri 934. The disable command signal 932 may be provided responsive to a disable command provided by a controller, such as the memory controller 210 if FIG. 2. The disable command may be provided by the memory controller prior to the $V_{cc\_peri}$ voltage source being disabled. The disable command may be specific to particular memory devices on the memory system. So, for example, referring to FIG. 2, the memory controller 210 may provide a disable command in advance of disabling $V_{cc\_peri}$ for the memory device 201. Referring back to FIG. 9, the disable command may be provided on the I/O bus 212, to the I/O circuits 225, and to the peripheral circuits 920. The peripheral circuits 920 may then provide shtdwn_cmd 932. The Lowvcc_peri 934 signal may be indicative of a voltage level of the $V_{cc\_peri}$ voltage supply, and may be provided in a same or analogous manner to the Lowvcc signal described above. For example, the voltage detector 700 of FIG. 7 may be used to provide the Lowvcc_peri signal 934.

The enabling circuits 930 may receive the shtdwn_cmd signal 932 and the Lowvcc_peri signal 934. The enabling circuits 930 provide the io_en signal. In particular, the enabling circuits 930 may provide a low io_en signal when the shtdwn_cmd signal 932 is high, indicating $V_{cc\_peri}$ is or may soon be disabled. Thereafter, the enabling circuits 930 may transition the io_en signal back to a high state when the Lowvcc_peri signal 934 indicate the $V_{cc\_peri}$ voltage has been enabled (e.g. restored).

Figure 10:
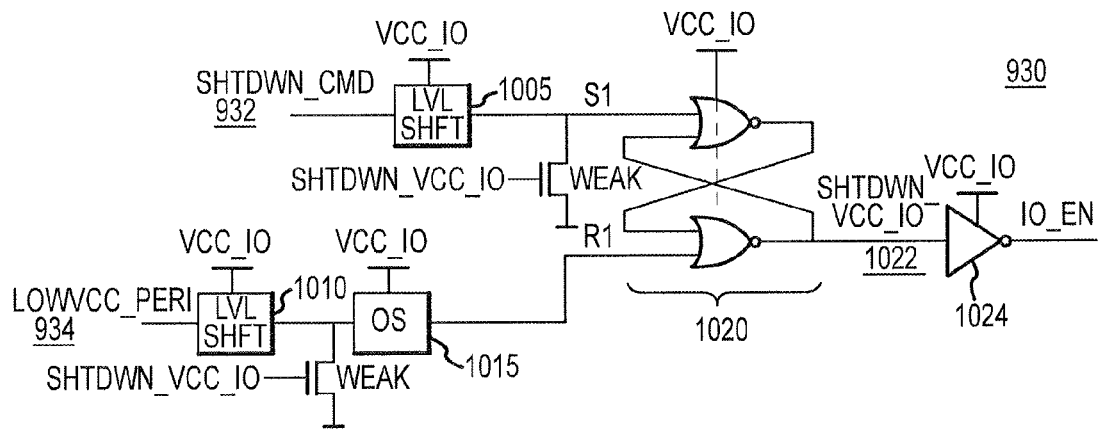
FIG. 10 is a schematic illustration of enabling circuits according to an embodiment of the present invention.

FIG. 10 is a schematic illustration of enabling circuits according to an embodiment of the present invention. The enabling circuits 930 as described above receive the shtdwn_cmd signal 932 and the Lowvcc_peri signal 934. The shtdwn_cmd signal 932 is received by a level shifter 1005. The shtdwn_cmd signal 932 may be provided, as described above, by the peripheral circuits 920 and accordingly may be provided in the $V_{cc\_peri}$ power domain. The level shifter 1005 may shift the voltage level of the shtdwn_cmd signal 932 to the $V_{cc\_io}$ power domain. The resultant signal is shown in FIG. 10 as S1. The Lowvcc_peri signal 934 may be received by another level shifter 1010. The level shifter 1010 may similarly shift the voltage level of the lowvcc_peri signal 934 from the $V_{cc\_peri}$ level to the $V_{cc\_io}$ level. The output of the level shifter 1010 is coupled to an input of a one shot pulse generator 1015. The one shot pulse generator 1015 may generate a pulse responsive to receipt of a high level signal from the level shifter 1010. The resulting signal is shown as R1 in FIG. 10.

The S1 signal is provided as an input to a latch 1020. Recall the S1 signal is a shifted version of the shtdwn_cmd signal 932. The S1 signal may accordingly set the latch 1020, to provide a high shtdwn_vcc_io signal 1022. The shtdwn_vcc_io signal 1022 may be provided to an inverter 1024 to provide a low io_en signal. In this manner, a low io_en signal may be provided responsive to receipt of a disable command signal, corresponding to a high shtdwn_cmd signal 932. The latch 1020 may hold the io_en signal high until the latch is reset. As shown in FIG. 10, the R1 signal may reset the latch. Recall the R1 signal may be a pulse generated responsive to a high lowvcc_peri signal 934. In this manner, once the lowvcc_peri signal 934 indicates $V_{cc\_peri}$ has returned to a sufficient voltage, the latch 1022 may be reset. Accordingly, the shtdwn_vcc_io signal 1022 may transition low, and the io_en signal in turn may transition high. In this manner, the latch 1020 may be set responsive to a disable command from a memory controller, providing a high io_en signal to disable I/O circuits. The latch 1020 may be reset responsive to an indication the $V_{cc\_peri}$ voltage has been enabled, providing a low io_en signal to enable I/O circuits.

Figure 11:
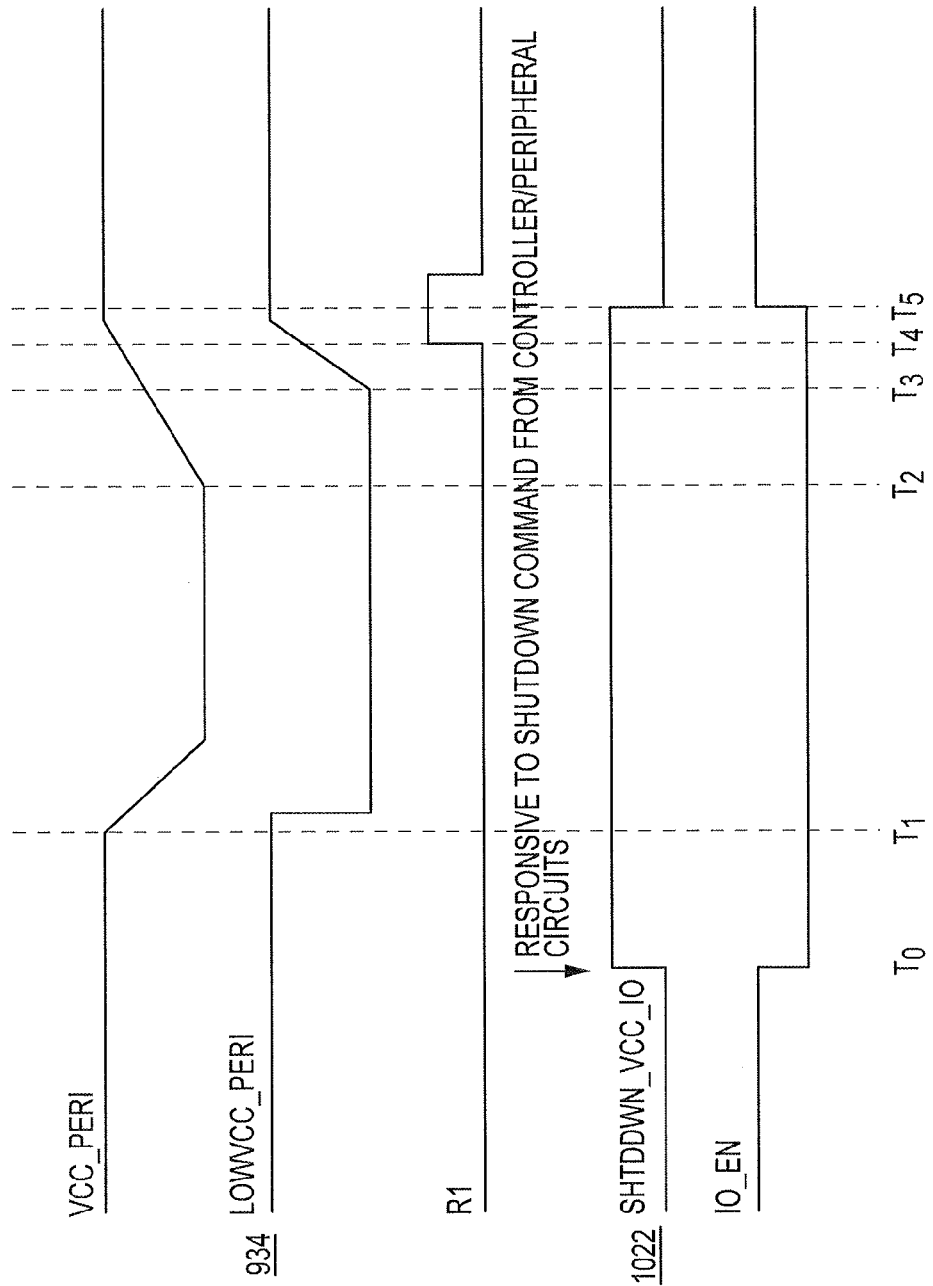
FIG. 11 is a timing diagram illustrating operation of the enabling circuits 930 of FIG. 10 in accordance with an embodiment of the present invention.

FIG. 11 is a timing diagram illustrating operation of the enabling circuits 930 of FIG. 10 in accordance with an embodiment of the present invention. The shtdwn_vcc_io signal 1022 is shown transitioning high at a time $t_0$. The shtdwn_vcc_io signal 1022 transitions high responsive to a disable command that may be received from a memory controller through peripheral circuits. The disable command may be sent prior to the $V_{cc\_peri}$ voltage transitioning low. In FIG. 11, the $V_{cc\_peri}$ signal begins to transition low at a later time $t_1$. As the $V_{cc\_peri}$ signal transitions low, the Lowvcc_peri signal also transitions low. Because the latch 1020 is set, the shtdwn_vcc_io signal remains high. At a time $t_2$, the $V_{cc\_peri}$ voltage is enabled. Once the $V_{cc\_peri}$ voltage has reached a determined voltage, as generally described above, the Lowvcc_peri signal 934 may transition high, beginning at a time $t_3$ in FIG. 11. Again, the latch 1020 remains set, so the shtdwn_vcc_io signal 1022 remains high, and the io_en signal remains low. As the Lowvcc_peri signal 934 transitions high, it may trigger the one shot 1015 to generate a pulse R1, at a time $t_4$ in FIG. 11. The R1 pulse resets the latch 1020, accordingly the shtdwn_vcc_io signal transitions low and the io_en signal transitions high at the time $t_5$ of FIG. 11.

Figure 12:
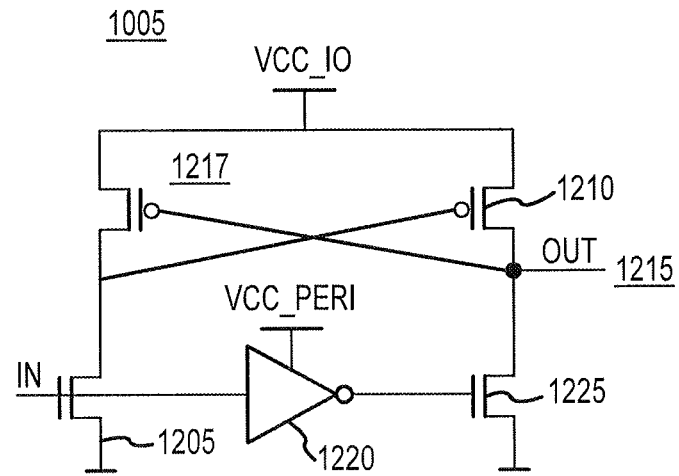
FIG. 12 is a schematic illustration of a level shifter according to an embodiment of the present invention.

FIG. 12 is a schematic illustration of a level shifter according to an embodiment of the present invention. The level shifter 1005 is used in the enabling circuit of FIG. 10, for example. The level shifter shown in FIG. 12 may also be used to implement the level shifter 1010 of FIG. 10, and/or the level converters described above with reference to FIG. 4. In other examples, other level shifting circuitry may be used. The level shifter 1005 of FIG. 12 may receive in input signal, such as the shtdwn_cmd signal 932 at a gate of the transistor 1205. A high signal at the gate of the transistor 1205 may turn on the transistor 1205, pulling the drain of the transistor 1205 to ground. The drain of the transistor 1205 is coupled to a gate of a p-FET transistor 1210. The low voltage on the gate of the p-FET transistor 1210 may turn on the p-FET transistor 1210, pulling an output node 1215 up to the voltage $V_{cc\_io}$. In this manner, a high input signal at a $V_{cc\_peri}$ level may be shifted to a high output signal at a $V_{cc\_io}$ level. The high output node 1215 may turn off the p-FET transistor 1217. The input signal is also provided to an inverter 1220. The output of the inverter 1220 is coupled to a gate of an n-FET transistor 1225. When the input signal is low, the signal on the gate of the transistor 1225 is high, turning off the transistor 1225. When the input signal is low, the signal on the gate of the transistor 1225 is high, turning on the transistor 1225 and pulling the output to ground.

Figure 13:
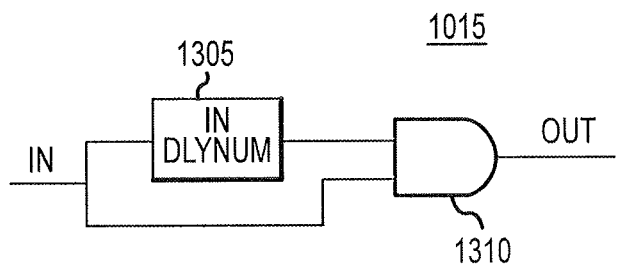
FIG. 13 is a schematic illustration of a one shot pulse generator in accordance with an embodiment of the present invention.

FIG. 13 is a schematic illustration of a one shot pulse generator in accordance with an embodiment of the present invention. The pulse generator 1015 may form part of the enabling circuit of FIG. 10. In other examples, other one shot pulse generator circuits may be used. The one shot pulse generator 1015 includes a delay element 1305 and an AND gate 1310. An input signal, such as a level-shifted version of the Lowvcc_peri signal of FIG. 10, may be provided to an input of the delay element 1305 and one input of the AND gate 1310. The delay element 1305 may hold a rising edge signal for a delay time before again transitioning low. The output of the delay element 1305 is provided to another input of the AND gate 1310. Accordingly, the AND gate 1310 may provide a pulse signal having a width corresponding to a time both the input signal and the delayed rising edge signal are high.

Figure 14:
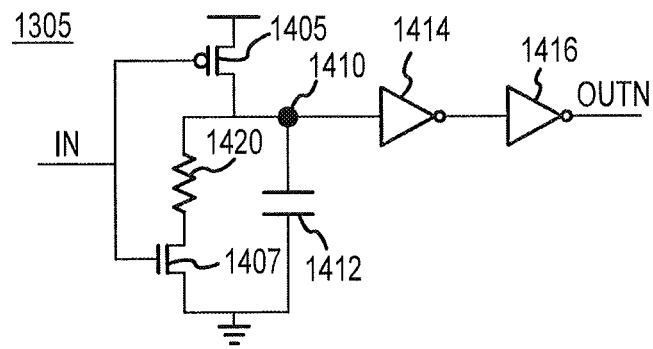
FIG. 14 is a schematic illustration of a delay element in accordance with an embodiment of the present invention.

FIG. 14 is a schematic illustration of a delay element in accordance with an embodiment of the present invention. The delay element 1305 may form part of the one shot circuit 1015 of FIG. 13. The input signal, which may be a level-shifted version of the Lowvcc_peri signal 934 is provided to the gates of both the p-FET transistor 1405 and the n-FET transistor 1407. When the input signal is low, the p-FET transistor 1405 may turn on, placing the node 1410 at a high voltage and charging the capacitor 1412. The node 1410 is coupled to an input of an inverter 1414, which in turn may provide a low signal. The output of the inverter 1414 is coupled to the input of an inverter 1416, which may provide a high signal. Accordingly, a low input signal to the delay element 1305 may provide a high output signal and charge the capacitor 1412. When the input signal transitions high, the n-FET transistor 1407 may turn on, connecting resistor 1420 between the node 1410 and ground. The p-FET transistor 1405 may be turned off. Accordingly, the capacitor 1412 may discharge to ground through the resistor 1420. In this manner, there is a period of time following the low-to-high transition of the input signal when the node 1410 remains high, and the output signal will also remain high. After that period of time, the capacitor 1412 may be depleted, and the node 1410 and the output signal may transition low. Referring back to FIG. 12, the AND gate 1310 may provide a high output signal when both the input signal and an output of the delay element 1305 are high. This condition will happen for the period of time following the low-to-high transition of the input signal while the capacitor 1412 is discharging. In this manner, the reset pulse R1, described above, may be generated.

Examples of enabling circuits have accordingly been described above which may provide a control signal. The control signal may be provided to the I/O circuits. The control signal may have one state corresponding to the $V_{cc\_peri}$ voltage being at a sufficient level for operation, and another state corresponding to the $V_{cc\_peri}$ voltage being at an insufficient level for circuit operation. Responsive to the control signal indicating $V_{cc\_peri}$ is insufficient for circuit operation, the I/O circuits may be disabled to reduce or eliminate a current path through the I/O circuits. In a multi-device memory system, the I/O circuits may be enabled or disabled on a per-device basis. In this manner, $V_{cc\_peri}$ may be disabled for particular ones of the memory devices, and the I/O circuits of those particular memory devices may also be disabled. In this manner, $V_{cc\_peri}$ may be disabled for one or more memory devices in a memory system while $V_{cc\_io}$ remains on.

The memory system shown in FIG. 2 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of enabling circuits described above to perform their ultimate user function.

From the foregoing it will be appreciated that, although specific embodiments of the invention have been described herein for purposes of illustration, various modifications may be made without deviating from the spirit and scope of the invention.

What is claimed is:

1. A system comprising:
    a controller;
    a plurality of devices coupled to the controller via an input/output (I/O) bus, wherein a device of the plurality of devices comprises:
        a memory array including a plurality of memory cells;
        a peripheral circuit coupled to the memory array and configured to receive a first supply voltage;
        an input/output circuit coupled to the I/O bus and configured to receive a second supply voltage having a voltage that is less than a voltage of the first supply voltage, wherein the input/output circuit is further configured to be disabled in accordance with a control signal; and
        an enabling circuit coupled to the I/O circuit and configured to provide the control signal based, at least in part, on the voltage of the first supply voltage transitioning below a threshold voltage.

2. The system of claim 1, wherein the enabling circuit is configured to provide the control signal to disable the input/output circuit when the first supply voltage is insufficient for operation of the input/output circuit.

3. The system of claim 1, wherein the enabling circuit is configured to disable the input/output circuits responsive to receipt of a disable command from the controller.

4. The system of claim 1, wherein the enabling circuit is configured to compare the first supply voltage with the threshold voltage.

5. A device comprising:
    an input/output configured to receive a first voltage supply, wherein the input/output circuit is configured to be disabled responsive to a control signal;
    a peripheral circuit coupled to the input/output circuit and configured to be receive a second voltage supply having a voltage that is greater than a voltage of the first voltage supply; and
    an enabling circuit coupled to the input/output circuits and configured to provide the control signal to disable the input/output circuit based on the second voltage supply transitioning below a threshold voltage.

6. The device of claim 5 wherein the enabling circuit comprises a first voltage detector configured to compare the voltage from the second voltage supply to the threshold voltage, and wherein the first voltage detector is configured to provide an output signal based on the comparison.

7. The device of claim 6 wherein the enabling circuit further comprises an interface circuit configured to provide the control signal to disable the input/output circuit responsive to the output signal indicating the voltage from the second voltage supply is equal to or below the threshold voltage.

8. The device of claim 7 wherein the enabling circuit further comprise a second voltage detector configured to compare the voltage from the first voltage supply to another threshold voltage, and wherein the second voltage detector is configured to provide another output signal based on the comparison.

9. The device of claim 8, wherein the interface circuit is further configured to receive the another output signal and provide the control signal to disable the input/output circuits responsive to the second output signal indicating the voltage from the first voltage supply is equal to or below the another threshold voltage.

10. The device of claim 5, wherein the input/output circuit includes an output buffer comprising logic circuitry configured to receive output data and the control signal; wherein the output buffer is configured to output the output data only when the control signal has a particular state.

11. The device of claim 5, wherein the input/output circuit includes an input buffer comprising logic circuitry configured to receive input data and the control signal; wherein the input buffer is configured to output the input data only when the control signal has a particular state.

12. The device of claim 5, wherein the peripheral circuit is configured to provide a disable command responsive to a command from a controller; and wherein the enabling circuit is configured to receive the disable command and generate the control signal responsive to receipt of the disable command.

13. The device of claim 2, wherein the peripheral circuit is further configured to provide a signal indicative of the second voltage supply being restored to enabled and wherein the enabling circuit is configured to receive the signal indicative of the second voltage supply being enabled and enable the input/output circuit responsive to the signal.

14. A device comprising:
    a plurality of devices;
    a controller;
    an input/output (I/O) bus coupled to the plurality of devices and the controller;
    wherein the plurality of devices each comprise:
        a memory array including a plurality of memory cells;
        a peripheral circuit coupled to the memory array and configured to receive a first supply voltage;

an input/output circuit coupled to the I/O bus and configured to receive a second supply voltage, different from the first supply voltage, wherein the input/output circuit is further configured to be disabled in accordance with a control signal; and an enabling circuit coupled to the I/O circuit and configured to provide the control signal based, at least in part, on a voltage of the first supply voltage, wherein the enabling circuit comprises a first voltage detector configured to compare a voltage from the second voltage supply to the threshold, and wherein the first voltage detector is configured to provide an output signal based on the comparison, wherein the enabling circuit further con rises an interface circuit configured to provide the control signal to disable the input/output circuit responsive to the output signal indicating the voltage from the second voltage supply is equal to or below the threshold voltage, wherein the enabling circuit further comprise a second voltage detector configured to compare a voltage from the first voltage supply to another threshold voltage, and wherein the second voltage detector is confirmed to provide another output signal based on the comparison wherein the enabling circuit further comprises an interface circuit configured to provide the control signal to disable the input/output circuit responsive to the output signal indicating the voltage from the second voltage supply is equal to or below the threshold voltage, wherein the interface circuit comprises:

a first subcircuit coupled to an output node and configured to pull the output node up to a high voltage responsive to the first and second output signals having a first state;

a second subcircuit coupled to the output node and configured to pull the output node down to a low voltage responsive to the first output signal having a second state;

a third subcircuit coupled to the output node and configured to pull the output node down to the low voltage responsive to the second output signal having the second state.

15. A device of comprising:
plurality of devices;
a controller;
an input/output (I/O) bus coupled to the plurality of devices and the controller;
wherein the plurality of devices each comprise:
a memory array including a plurality of memory cells;
a peripheral circuit coupled to the memory array and configured to receive a first supply voltage, wherein the peripheral circuit is configured to provide a disable command responsive to a command from a controller, wherein the peripheral circuit is further configured to provide a signal indicative of the second voltage supply being restored to enabled;
an input/output circuit coupled to the I/O bus and configured to receive a second supply voltage, different from the first supply voltage, wherein the input/output circuit is further configured to be disabled in accordance with a control signal; and
an enabling circuit coupled to the I/O circuit and configured to provide the control signal based, at least in part, on a voltage of the first supply voltage, wherein the enabling circuit is configured to receive the disable command and generate the control signal responsive to receipt of the disable command, wherein the enabling circuit is configured to receive the signal indicative of the second voltage supply being enabled and enable the input/output circuit responsive to the signal, wherein the enabling circuit comprises a latch, wherein the latch is configured to be set responsive to the disable command and wherein the latch is configured to be reset responsive to the signal indicative of the second voltage supply being enabled.

16. The device of claim 15, wherein the enabling circuit further includes a one shot pulse generator configured to generate the signal indicative of the second voltage supply being enabled.

17. A method for power management comprising:
disabling a first voltage supply from powering a peripheral circuit of a device;
disabling an input/output circuit coupled to the peripheral circuit responsive to a voltage of the first voltage supply transitioning below a threshold voltage, wherein the input/output circuit is configured to be powered by a second voltage supply having a voltage that is less than a voltage of the first voltage supply.

18. The method for power management of claim 17, wherein the input/output circuit is disabled responsive to a disable command received from a controller.

19. The method for power management of claim 18, wherein the disable command is received prior to disabling the first voltage supply from powering the peripheral circuit.

20. The method for power management of claim 17, further comprising comparing a voltage received from the first voltage supply with the threshold voltage, and wherein disabling the input/output circuit occurs responsive to the comparing indicating the voltage is equal to or below the threshold voltage.

21. The method for power management of claim 17, wherein disabling the input/output circuit comprises providing a signal having a particular state to logic circuitry of the input/output circuit.

22. A method for power management in a system, wherein the first voltage supply is provided to input/output circuits of a plurality of devices of the system and a second voltage supply is provided to peripheral circuits of the plurality of devices of the system, the method comprising:
disabling the second voltage supply for a selected one of the plurality of devices of the memory system, wherein the second voltage supply has a voltage that is less than a voltage of the first voltage supply; and
disabling the input/output circuit of the selected one of the plurality of devices responsive to the voltage of the second voltage supply transitioning below a threshold voltage.

23. The method for power management of claim 22, wherein disabling the second voltage supply for a selected one of the plurality of devices of the system comprises disabling the second voltage supply for selected ones of the plurality of devices of the system; and wherein disabling the input/output circuit of the selected one of the plurality of devices comprises disabling the input/output circuit of the selected ones of the plurality of devices.

24. The method for power management of claim 22, wherein said disabling the input/output circuits comprises providing a control signal to the input/output circuit of the selected one of the plurality of devices.

25. The method for power management of claim 22, wherein said disabling the second voltage supply occurs responsive to a disable command from a controller; and wherein said disabling the input/output circuit of the selected one of the plurality of devices occurs responsive to the disable command.

26. The method for power management of claim 22, further comprising comparing, at the selected one of the plurality of devices, a voltage from the second voltage supply with the threshold voltage; and wherein said disabling the input/output circuit of the selected one of the plurality of devices is based, at least in part, on the comparison.

* * * * *

UNITED STATES PATENT AND TRADEMARK OFFICE
CERTIFICATE OF CORRECTION

| | |
|---|---|
| PATENT NO. | : 8,675,420 B2 |
| APPLICATION NO. | : 13/116914 |
| DATED | : March 18, 2014 |
| INVENTOR(S) | : Toru Tanzawa et al. |

Page 1 of 1

It is certified that error appears in the above-identified patent and that said Letters Patent is hereby corrected as shown below:

In the Claims

Column 14, line 53, in claim 13, delete "claim 2," and insert -- claim 12, --, therefor.

Column 15, line 14, in claim 14, delete "con rises" and insert -- comprises --, therefor.

Column 15, line 22, in claim 14, delete "confirmed" and insert -- configured --, therefor.

Column 15, lines 23-24, in claim 14, delete "comparison" and insert -- comparison, --, therefor.

Column 15, line 42, in claim 15, after "device" delete "of".

Column 15, line 43, in claim 15, before "plurality" insert -- a --.

Signed and Sealed this
Twenty-ninth Day of July, 2014

Michelle K. Lee
*Deputy Director of the United States Patent and Trademark Office*